United States Patent
Okamura et al.

(10) Patent No.: US 6,739,495 B2
(45) Date of Patent: May 25, 2004

(54) FRICTION STIR WELDING METHOD AND COMPONENT PART WELDED BY THE METHOD

(75) Inventors: Hisanori Okamura, Tokai-mura (JP); Kinya Aota, Hitachi (JP); Kouji Satou, Hitachi (JP); Masahiko Sakamoto, Hitachi (JP)

(73) Assignee: Hitachi, Ltd. (JP)

( * ) Notice: Subject to any disclaimer, the term of this patent is extended or adjusted under 35 U.S.C. 154(b) by 0 days.

(21) Appl. No.: 10/346,075

(22) Filed: Jan. 17, 2003

(65) Prior Publication Data

US 2003/0102354 A1 Jun. 5, 2003

Related U.S. Application Data

(63) Continuation of application No. 10/200,514, filed on Jul. 23, 2002.

(30) Foreign Application Priority Data

Jul. 25, 2001 (JP) ........................................ 2001-223768
Jul. 15, 2002 (JP) ........................................ 2002-204976

(51) Int. Cl.⁷ ............................................. B23K 20/12
(52) U.S. Cl. ..................................... 228/112.1; 228/2.1
(58) Field of Search ............................. 228/112.1, 2.1; 257/625, 675, 706; 174/16.3; 361/247.3, 709

(56) References Cited

U.S. PATENT DOCUMENTS

| | | | | |
|---|---|---|---|---|
| 6,045,028 | A | * | 4/2000 | Martin et al. |
| 6,227,432 | B1 | * | 5/2001 | Enomoto et al. |
| 6,325,273 | B1 | * | 12/2001 | Boon et al. |
| 6,543,671 | B2 | * | 4/2003 | Hatten et al. |
| 6,637,109 | B2 | * | 10/2003 | Nyqvist ................... 29/890.03 |
| 2003/0024965 | A1 | * | 2/2003 | Okamura et al. |
| 2003/0042292 | A1 | * | 3/2003 | Hatten et al. |
| 2003/0056368 | A1 | * | 3/2003 | Nyqvist ................... 29/890.03 |
| 2003/0102354 | A1 | * | 6/2003 | Okamura et al. |
| 2003/0210527 | A1 | * | 11/2003 | Saita et al. ................. 361/700 |

FOREIGN PATENT DOCUMENTS

| JP | 11047960 A | * | 2/1999 |
|---|---|---|---|
| JP | 2000150738 A | * | 5/2000 |
| JP | 2002066765 A | * | 3/2002 |
| JP | 2003089884 A | * | 3/2003 |

* cited by examiner

Primary Examiner—Kiley Stoner
(74) Attorney, Agent, or Firm—Dickstein Shapiro Morin & Oshinsky LLP (57) ABSTRACT

Disclosed is a friction stir welding method for welding two members to be welded which differ in physical properties and/or mechanical properties by abutting the two members to each other, inserting a pin portion of a rotary tool having the pin portion and a shoulder portion to the abutment surfaces of the two members, and moving the rotary tool along the abutment surfaces. The pin portion is inserted to only one of the members, the pin portion is not inserted to the other of the members but only the shoulder portion is set in contact with the other of the members, and, while this condition is maintained, the rotary tool is moved. With this method, only the member on the side where the pin is inserted can be made to undergo plastic flow attendant on a friction stir action. The metal in plastic flow is pressed against the opposite member at an elevated temperature and high pressure, whereby diffusion of atoms is caused in the vicinity of the abutment surfaces, and the members are welded.

5 Claims, 6 Drawing Sheets

FRICTION STIR WELDING METHOD AND COMPONENT PART WELDED BY THE METHOD

This is a continuation of U.S. patent application Ser. No. 10/200,514, filed Jul. 23, 2002, the entire disclosure of which is incorporated herein by reference.

BACKGROUND OF THE INVENTION

1. Field of the Invention

The present invention relates to a friction stir welding method for welding by use of a rotary tool having a pin portion and a shoulder portion. In addition, the present invention relates to a welded component part obtained by the friction stir welding method.

2. Description of the Prior Art

The friction stir welding method is a method wherein a pin portion of a rotary tool made of a material harder than members to be welded is inserted between abutment surfaces of the members to be welded, and frictional heat and plastic flow are caused at the abutment surfaces by rotation and movement of the rotary tool, thereby welding the members. One example of the friction stir welding method is described in Japanese Patent Laid-open No. 11-10368 (1999). Since the members to be welded can be welded at a temperature equal to the melting point or below thereof by the friction stir welding, this technique has the effects that strain after welding is little, the surfaces of the members remain aesthetically good, and so on.

The friction stir welding method is suitable for welding members which are the same or similar in physical properties or mechanical properties. However, where the members to be welded are conspicuously different in physical properties, for example, melting point or density, or where the members to be welded are conspicuously different in mechanical properties, the friction stir welding method results in that a defective weld is liable to be generated and a sound weld is difficult to obtain.

SUMMARY OF THE INVENTION

OBJECT OF THE INVENTION

It is an object of the present invention to provide a friction stir welding method such that even members different in physical properties or mechanical properties can be welded in good conditions by the friction stir welding technique.

STATEMENT OF THE INVENTION

The present invention resides in that friction stir welding is conducted such that members to be welded are abutted against each other, a pin portion of a rotary tool is inserted to one of the members, while the pin portion is not inserted to the other of the members but only a shoulder portion of the rotary tool is brought into contact with the other of the members.

According to the welding method of the present invention, frictional heat and plastic flow due to a friction stir action are generated on the side of the member where the pin portion of the rotary tool is inserted, the frictional head is transferred to the member on the side where the pin portion is not inserted, and diffusion of atoms is generated in the vicinity of the abutment surfaces of both the members, whereby diffusion bonding is achieved. Thus, the present invention is not a conventional simple friction stir welding but is a novel friction stir welding.

In carrying out the welding method according to the present invention, it is desirable that a coat layer of a metal capable of easily coupling with the opponent member on a metallic basis is provided on one or both of the abutment surfaces of the members to be welded. In addition, it is desirable that holes are provided in the welding surface of the member to be welded on the side where the pin portion of the rotary tool is not inserted. Further, it is desirable that an upper surface of the member to be welded on the side where the pin portion of the rotary tool is not inserted is covered with the same material as that of the other member to be welded, and the shoulder portion of the rotary tool is brought into contact with the cover portion.

BRIEF DESCRIPTION OF THE DRAWINGS

Other objects and advantages of the invention will become apparent from the following description of embodiments with reference to the accompanying drawings in which.

DESCRIPTION OF THE PREFERRED EMBODIMENTS

The welding method according to the present invention is extremely suitable for welding copper or a copper alloy and aluminum or an aluminum alloy, copper or a copper alloy and titanium or a titanium alloy, iron or an iron alloy and aluminum or an aluminum alloy, and copper or a copper alloy and iron or an iron alloy. In addition, the welding method is suitable also for welding magnesium or a magnesium alloy and copper or a copper alloy, and magnesium or a magnesium alloy and iron or an iron alloy.

Copper and aluminum has a solid solubility at room temperature of as extremely low as not more than 10%, and it is impossible or extremely difficult to weld copper and aluminum by an ordinary welding method. Even where copper and aluminum are subjected to friction stir welding by use of a rotary tool having a pin portion and a shoulder portion, it is difficult to obtain a sound weld. According to experiments conducted by the present inventors, friction stir welding of copper and aluminum resulted in that void was generated in the weld and a multiplicity of burrs were generated at the surface portion of the weld.

By applying the present invention, however, even in the case of welding copper and aluminum by the friction stir welding method, a sound weld free of voids and burrs can be obtained.

The welding method according to the present invention can be applied also to the cases of welding a single crystal metal, a directionally solidified metal or a powder dispersion reinforced material to an ordinary metallic material. In this case, according to the present invention, it is possible to achieve welding without impairing the single crystal structure, the directionally solidified structure or the powder dispersion properties. The welding method according to the present invention can be applied also to the cases of welding a ceramic and a metallic material, and an organic material and a metallic material.

Figure 1:
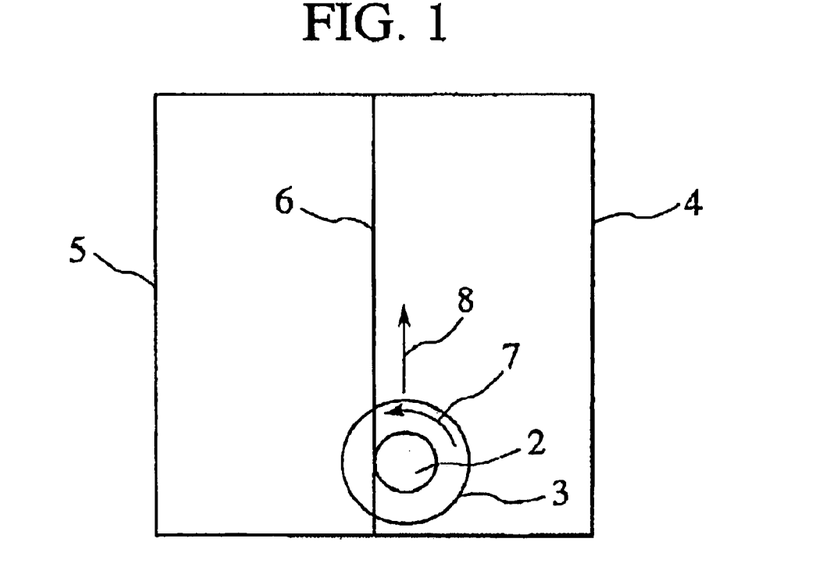
FIG. 1 is a plan view showing a friction stir welding method according to one embodiment of the present invention.
Figure 2:
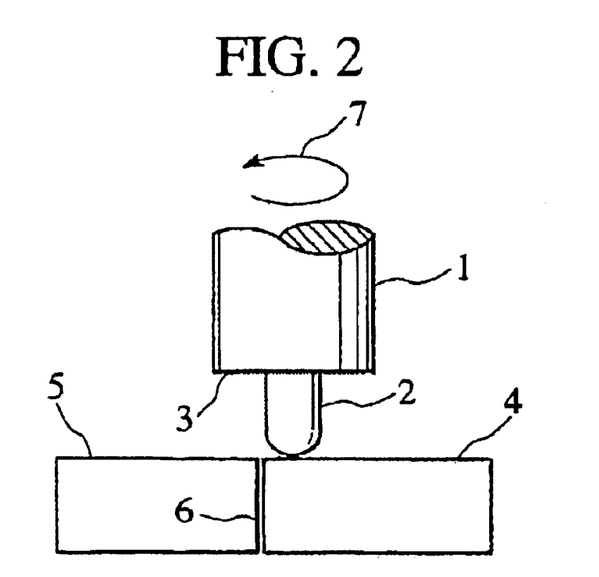
FIG. 2 is a side view showing the friction stir welding method according to the embodiment of the present invention, showing the condition before welding.
Figure 3:
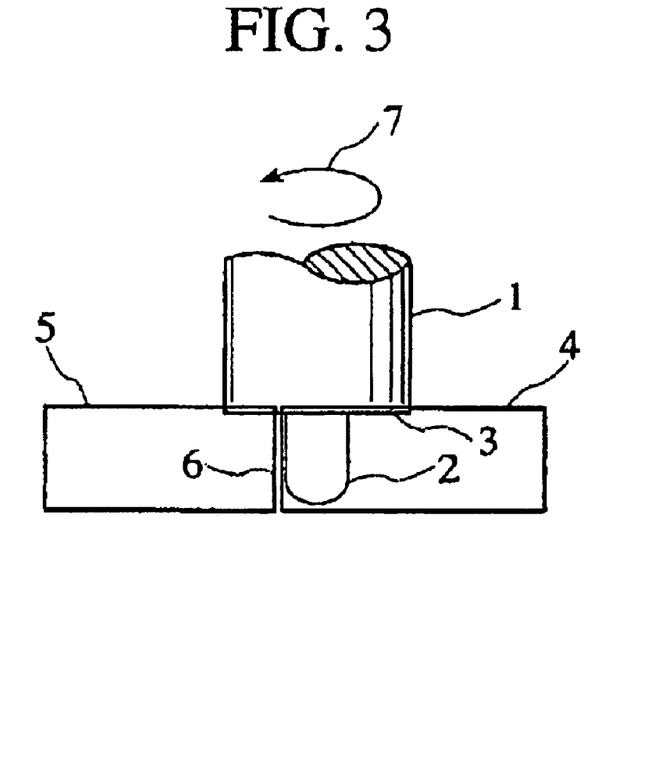
FIG. 3 is a side view showing the friction stir welding method according to the embodiment of the present invention, showing the condition during welding.

FIGS. 1 to 3 show one embodiment of the present invention. The case of welding aluminum and copper will be described as an example.

A rotary tool 1 has a pin portion 2 and a shoulder portion 3. The friction stir welding is conducted by inserting the pin portion 2 of the rotary tool 1 to the members to be welded and moving the rotary tool 1. The pin portion 2 is inserted to the side of one of the members 4, 5 to be welded, and the pin portion 2 is not inserted to the side of the other of the members 4, 5 to be welded. In this case, the shoulder portion 3 of the rotary tool 1 is set in contact with the upper surface of the member to be welded on the side where the pin portion 2 is not inserted. It is desirable that the insertion position of the pin portion 2 is as close as possible to the abutment surfaces 6 of the members to be welded. Thus, with the rotation and movement of the rotary tool 1, a friction stir action by the pin is generated on the side of the member where the pin portion 2 is inserted, resulting in a plastic flow phenomenon. On the side of the other member, the pin is not inserted, and therefore, the friction stir action is not generated. Frictional heat due to the friction stir action by the pin is generated only on the side of the member where the pin is inserted, and the frictional heat is transferred to the member on the opposite side where the pin is not inserted, so that the member on the opposite side is also heated. The vicinity of the pin insertion portion of the member where the pin is inserted is in a high-temperature high-pressure condition due to the centrifugal force and frictional heat generated by the rotation of the pin. The member in this high-temperature high-pressure condition is pressed against the member on the opposite side at a high pressure due to the plastic flow. As a result, an atom diffusion phenomenon peculiar to metal is generated at the abutment surfaces 6 of both of the members, whereby both of the members are diffusion bonded.

When a component part welded by the welding method according to the present invention is inspected, a trace of plastic flow is seen on the side of one of the members, and a reaction layer attendant on the diffusion of atoms is seen at the abutment surfaces of both of the members. Since an intermetallic compound which is a brittle material is liable to be formed at the reaction layer, it is desirable that the reaction layer is as thin as possible, for example, not more than 5 $\mu$m in thickness. Where the thickness of the reaction layer is as great as 50 $\mu$m or more, the weld is extremely low in mechanical strength, and breakage starting from the weld is liable to occur. In order to reduce the thickness of the reaction layer formed at the welding interface, it is desirable to insert the pin portion on the side of the member which is lower in melting point. Where the pin portion is inserted on the side of the member higher in melting point, the plastic flow portion reaches a higher temperature, so that diffusion is liable to proceed more rapidly, it becomes difficult to control the thickness of the reaction layer, and the reaction layer is liable to be formed in a larger thickness, as compared with the case where the pin portion is inserted on the side of the member lower in melting point. The insertion of the pin portion on the side of the member lower in melting point also has the effects that the life of the rotary tool can be prolonged, and plastic flow can be caused at a lower temperature. The thickness of the reaction layer can be regulated also by controlling the rotational speed of the rotary tool.

The welding method according to the present invention utilizes the plastic flow due to the friction stir action. Therefore, it is also desirable to insert the pin portion of the rotary tool on the side of the member which is more liable to undergo plastic flow.

As a known method for welding two members differing in mechanical properties and physical properties, there is a diffusion bonding method. This method requires heating the members to be welded in a furnace and in vacuum and application of a conspicuously high pressure to the abutment surfaces. As compared with the diffusion bonding method, the welding method of the present invention does not require welding in vacuum and is extremely easy to carry out.

By the method shown in FIGS. 1 to 3, an aluminum member 4 and a copper member 5 were welded. A rotary tool 1 made of iron and having a pin portion 2 of 6 mm in diameter and 5 mm in length and a shoulder portion of 15 mm in diameter was used. Both of the members to be welded had a thickness of 6 mm. The pin portion 2 of the rotary tool 1 was inserted on the side of the aluminum member 4, and welding was conducted while rotating the tool 1 counterclockwise relative to the moving direction of the tool 1, namely, in the direction of arrow 7, with a tool rotational frequency of 1500 rpm and a tool movement velocity of 100 mm/min. As a result, a sound weld free of defects such as void was obtained. In addition, pairs of a single crystal material of nickel and stainless steel, a directional crystal material and stainless steel, and an alumina dispersion reinforced alloy and carbon steel were welded by the method shown in FIG. 1 by inserting the pin portion of the rotary tool on the side of stainless steel and on the side of carbon steel, respectively. In each of the cases, a sound weld free of defects was obtained.

The rotary tool, in many cases, has a pin portion which is threaded. Where the pin portion is threaded, the rotating direction of the rotary tool is important. For example, where the pin portion is threaded clockwise toward the tip end portion of the pin, it is desirable to rotate the rotary tool counterclockwise. Where the pin portion is threaded counterclockwise, it is naturally desirable to rotate the rotary tool clockwise. Thus, the plastic flow is caused to occur downwards, so that it is possible to prevent the flowing metal from flowing out to the surface of the weld portion to form burrs. When the rotating direction of the tool is inverted, an upward plastic flow phenomenon occurs, so that the metal in plastic flow will flow out to the surface to form burrs on the surface of the weld, and void will be generated in the weld.

Figure 4:
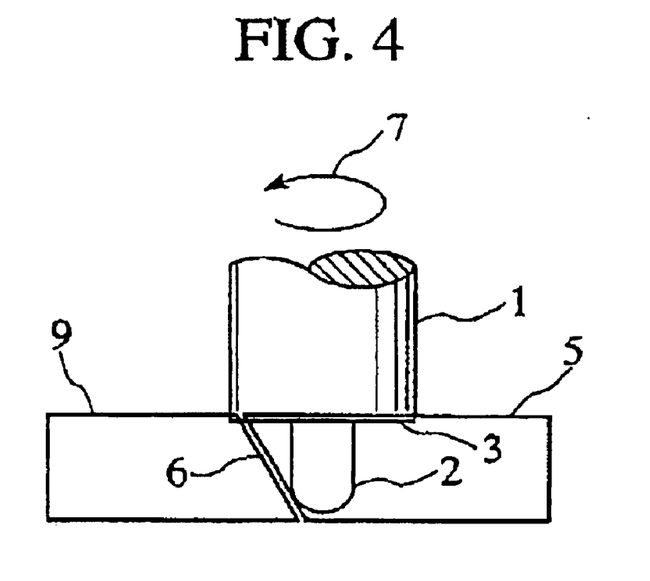
FIG. 4 is a side view showing a friction stir welding method according to another embodiment of the present invention.
Figure 5:
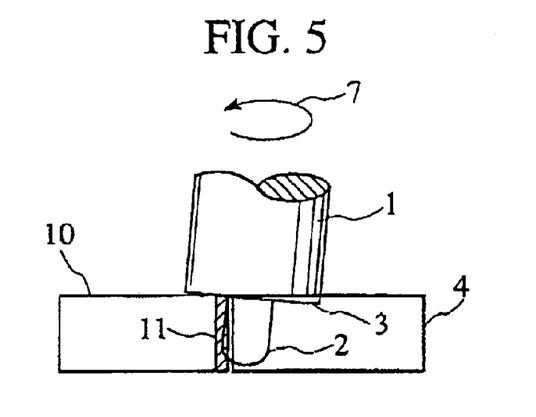
FIG. 5 is a side view showing an example of performing friction stir welding by forming a metallic coat layer on the welding surface of one of the members to be welded, in another embodiment of the present invention.

According to a method shown in FIGS. 4 and 5, it is possible to further enhance soundness of the weld at the tip end portion of the pin. As for the temperature profile in the vicinity of the weld portion in the case where the rotary tool is inserted to the members to be welded and the profile of frictional heat, the temperature is highest in the vicinity of the center portion of the rotary tool, while on the other hand the frictional heat is lowest in the vicinity of the tip end of the pin of the rotary tool. In order to prevent an unwelded portion from being left at the tip end portion of the pin, it is desirable to set the center portion of the tip end of the pin close to the abutment surfaces of the members to be welded. Where the abutment surfaces of the members to be welded are inclined, as shown in FIG. 4, and the rotary tool is vertically inserted towards the members to be welded from above, it is possible to set the center portion of the tip end of the pin close to the abutment surfaces. In the case where the abutment surfaces of the members to be welded are vertical or roughly vertical, the pin portion of the rotary tool is slantly inserted toward the abutment surfaces as shown in FIG. 5, whereby the center portion of the tip end of the pin can be set close to the abutment surfaces.

By the method shown in FIG. 4, a copper member 5 and a titanium member 9 were welded together at a rotational frequency of the rotary tool of 1500 rpm and a moving velocity of the tool of 50 mm/min, upon which a sound weld free of defects was obtained. Copper and titanium have a melting point difference of 400° C. and a solid solubility at room temperature as low as not more than 1%. By inserting the pin portion of the rotary tool to the side of copper which has a lower melting point and is more likely to be plastically deformed, it is possible to obtain a sound weld of both metals by the friction stir welding technique.

FIG. 5 shows an embodiment of welding two members by providing the welding surface of one of the members with a coat layer of a metal capable of being easily coupled, with the other of the members on a metallic basis. The coat layer of a metal may be provided on either one or both of the members to be welded. Where the coat layer of a metal is provided on one of the members, the coat layer should be provided on the side where the pin portion of the rotary member is not inserted. In this case, as shown, the pin can be inserted up to the portion of the coat layer. Where a coat layer of a metal capable of being easily coupled with both members on a metallic basis is preliminarily provided on the welding surface or surfaces of one or both of the members to be welded, there is obtained the effect of causing diffusion to swiftly proceed without increasing the thickness of the reaction layer. By the method shown in FIG. 5, an iron member 10 and an aluminum member 4 were welded by providing a nickel-plating layer 11 of 10 μm in thickness on the surface of the iron member 10. In the case of welding iron and aluminum, there is the tendency that the thickness of the reaction layer formed on the welding surfaces will be large, but nickel has the effect of suppressing the thickness of the reaction layer to be small. According to the present embodiment, welding was conducted at a rotational frequency of the tool of 2000 rpm and a moving velocity of the tool of 50 mm/min. As a result, the thickness of the reaction layer was as small as not more than 0.5 μm, and a weld having the same degree of tensile strength as the aluminum member was obtained. The weld was free of defects such as voids.

Figure 6:
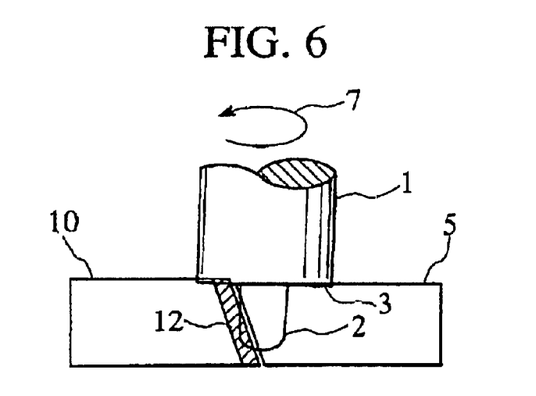
FIG. 6 is a side view showing another example of performing friction stir welding by forming a metallic coat layer on the welding surface of one of the members to be welded.

FIG. 6 shows the case of providing a coat layer of a metal on the welding surface of one of the members to be welded, in the method shown in FIG. 4. A layer 12 of a solder material composed of silver and copper and having a melting point of 800° C. was clad on the surface of an iron member 10 by pressure welding, and welding of the iron member 10 and a copper member 5 was conducted at a rotational frequency of the rotary tool of 2000 rpm and a moving velocity of the tool of 10 mm/min, upon which a sound weld free of defects was obtained. In the case of welding of iron and copper, it is preferable to suppress the thickness of the reaction layer formed at the welding surfaces to or below 0.5 μm, and this can be achieved by the method according to the present embodiment.

Figure 7:
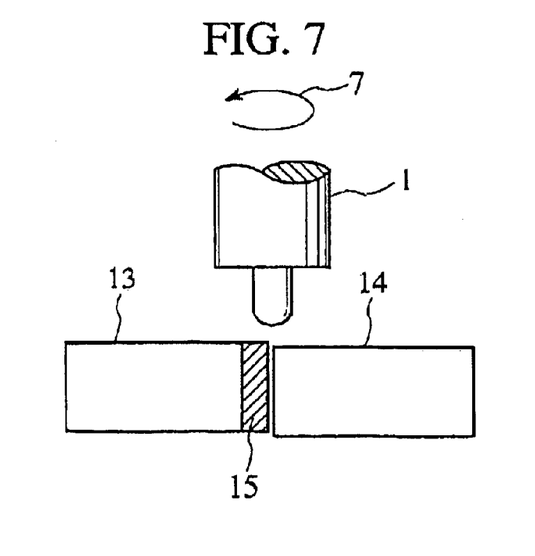
FIG. 7 is a side view showing a further example of performing friction stir welding by forming a metallic coat layer on the welding surface of one of the members to be welded.

FIG. 7 shows an embodiment in which a coat layer of a metal is provided in a large thickness on the welding surface of one of the members to be welded, and frictional stir welding is conducted by inserting a pin portion of a rotary tool between the other of the members and the metal coat layer. A stainless steel member 13 and a copper alloy member 14 each being 5 mm in thickness, 100 mm in width and 200 mm in length were subjected to friction stir welding by providing a clad layer 15 of 10 mm in thickness of the same material as the copper alloy member 14 on the surface of the stainless steel member 13 and using a rotary tool having a pin portion diameter of 3 mm, a pin length of 4.5 mm and a shoulder portion diameter of 8 mm, upon which a sound weld free of defects was obtained.

According to the method shown in FIG. 7, welding of a copper alloy member and an aluminum member was also conducted. Both members were 2 mm in thickness, 100 mm in width and 5 mm in length. A clad layer of 5 mm in thickness of the same material as the aluminum alloy member was provided on the copper alloy side by cold rolling. A rotary tool having a pin portion diameter of 2 mm, a pin length of 1.5 mm and a shoulder portion diameter of 5 mm and provided with a spiral thread clockwise toward the tip end of the pin was used. The pin portion of the rotary tool was inserted so as to be astride the aluminum member and the clad layer. As a result, a sound weld free of defects was obtained.

By the method shown in FIG. 7, a ceramic member consisting of aluminum nitride and an aluminum alloy were welded. A clad layer of 4 mm in thickness of the same material as the aluminum member was preliminarily formed on the ceramic member side. As a result, good welding could be achieved.

Figure 8:
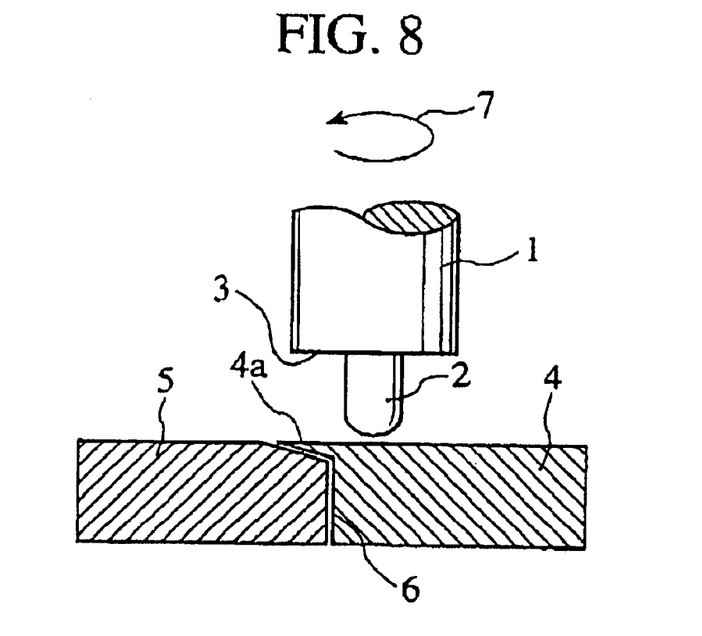
FIG. 8 is a side view of a further embodiment of the friction stir welding method according to the present invention, showing the condition before welding.
Figure 9:
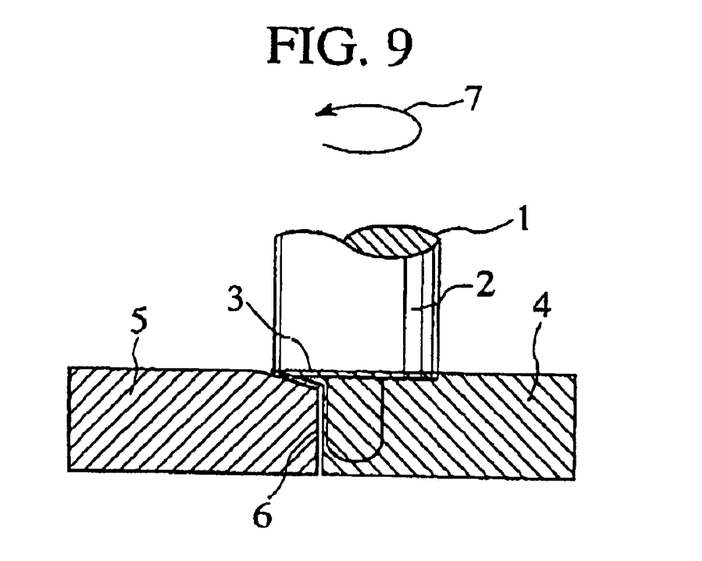
FIG. 9 is a side view showing the condition during welding, in the welding method of FIG. 8.
Figure 10:
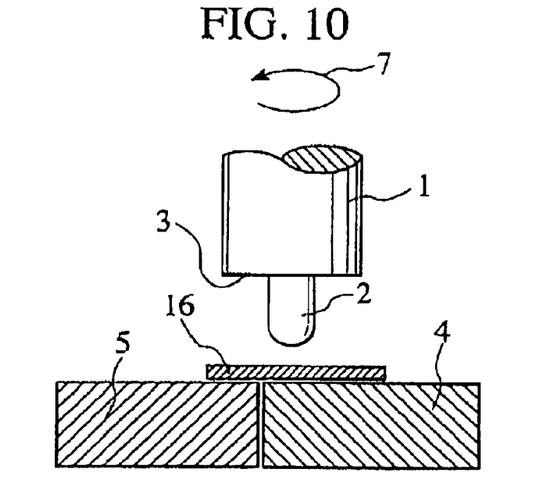
FIG. 10 is a side view showing a further embodiment of the friction stir welding method according to the present invention, showing the condition before welding.
Figure 11:
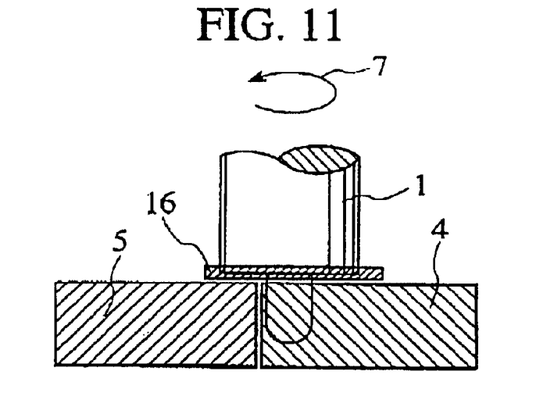
FIG. 11 is a side view showing the condition during welding, in the welding method of FIG. 10.

In the case where two members differing in physical properties and mechanical properties are subjected to frictional stir welding by the method of the present invention, stirring and mixing of both members may slightly occur in the vicinity of the upper surface with which the shoulder portion of the rotary tool makes contact. In order to suppress the stirring and mixing, it is desirable to chamfer the upper surface of the member on the side where the pin is not inserted and to project a part of the member on the side where the pin is inserted to the chambered portion so as to form a roof there, as shown in FIGS. 8 and 9. In addition, as shown in FIGS. 10 and 11, it is desirable that a plate of the same material as the member on the side where the pin is inserted is disposed on a portion with which the shoulder portion of the rotary tool makes contact. FIGS. 8 and 9 show an example of welding of an aluminum member 4 and a copper member 5, in which part of an upper portion of the copper member 5 is slantly cut off, part of the aluminum member 4 is projected there to form a roof 4a, and the shoulder portion 3 of the rotary tool 1 is brought into contact only with the aluminum member. FIGS. 10 and 11 show an example of welding in which a plate 16 of the same material as the aluminum member 4 is disposed at an upper portion of the abutment surfaces of the aluminum member 4 and the copper member 5, and welding is conducted under the condition where the shoulder portion 3 does not make contact with the copper member 5. Thus, stirring and mixing of both members in the vicinity of the upper portion with which the shoulder portion makes contact can be suppressed. The methods as shown in FIGS. 8 to 11 were found effective for practical welding of copper and aluminum and of copper and titanium.

Figure 12:
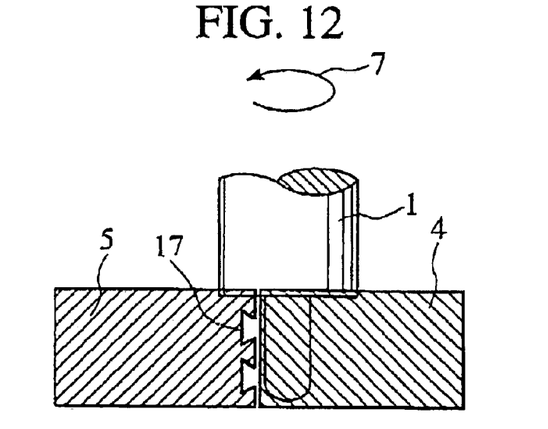
FIG. 12 is a side view showing another embodiment of the present invention.

FIG. 12 shows an example of welding two members to be welded in which the welding surface of one of the members is provided with a hole or holes. The hole or holes 17 are provided on the side where the pin of the rotary tool is not inserted. One or a plurality of the holes may be provided. The hole is desirably smaller at the entrance and larger in the inside. When friction stir welding is conducted according to the present invention in this manner, a metal in plastic flow enters the hole or holes 17. As a result, the portion of the hole or holes plays the role of a wedge, whereby mechanical connection is added. Thus, a component part based on both diffusion bonding and mechanical connection can be obtained. It was verified that this method was effective in welding iron and aluminum.

Figure 13:
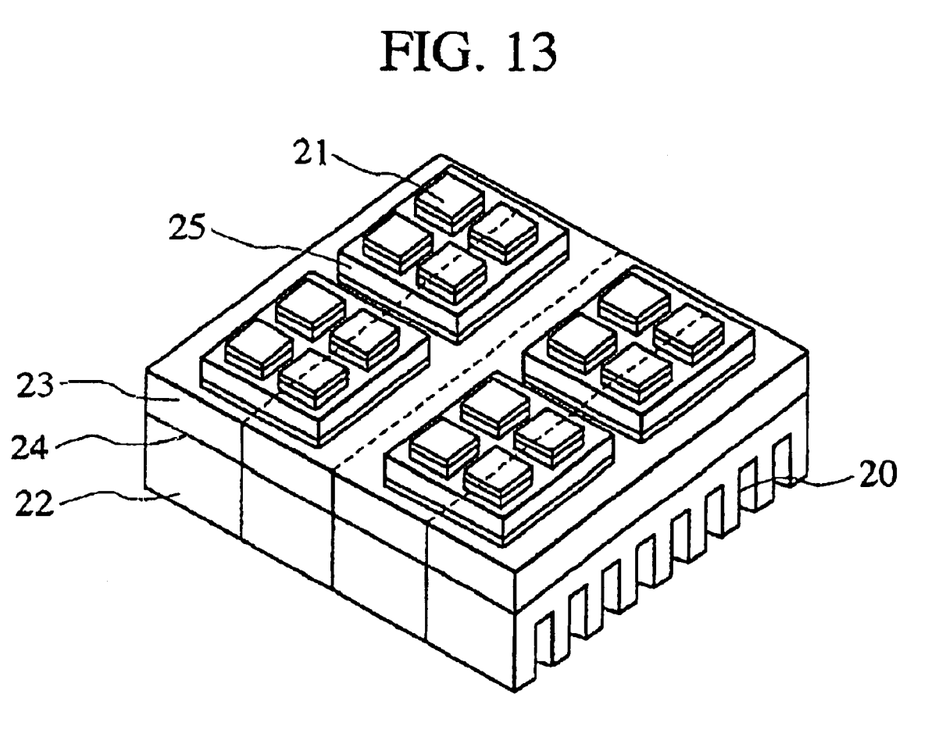
FIG. 13 is a perspective view showing an example of a semiconductor apparatus comprising a heat sink produced by the welding method according to the present invention.

The welding method according to the present invention is applicable to a wide field, such as component parts of a heat exchanger, component parts of an automobile, component parts of a semiconductor apparatus, component parts of a generator, or component parts of a railroad vehicle. FIG. 13 shows an example of a semiconductor apparatus in which semiconductor devices 21 are mounted on a heat sink 30 manufactured by application of the welding technique according to the present invention. The heat sink 20 has a structure in which abutment surfaces 24 of aluminum 22 and copper 23 are welded by the friction stir welding according to the present invention, fins are provided on the side of aluminum 22, and semiconductor devices are mounted on copper 23. The semiconductor devices 21 and an insulating substrate 25 are soldered to each other, and the insulating substrate 25 and copper 23 are also soldered to each other.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A friction stir welding method for abutting and welding two members to be welded which differ in physical properties and/or mechanical properties by a friction stir welding technique by use of a rotary tool having a pin portion and a shoulder portion, wherein a welding surface of at least one of said two members is covered with a metal capable of being coupled with both of said members on a metallic basis, said pin portion of said rotary tool is inserted to said members from above the abutment surfaces of said members, wherein said pin portion of said rotary tool is inserted in the state of being biased to the side of the other of said members so that said pin portion is inserted to the coat layer of said metal formed on one of said members but does not reach said one of said members, said shoulder portion of said rotary tool is set in contact with said one of said members on the side where said pin portion is not inserted, and, while this condition is maintained, welding is conducted; and wherein said pin portion of said rotary tool is inserted to the member having a lower melting point, of said two members to be welded.

2. A friction stir welding method as set forth in claim 1, wherein one of said members to be welded is iron or an iron alloy, while the other of said members is copper or a copper alloy, the welding surface of said iron or iron alloy is coated with an alloy of silver and copper, and said pin portion of said rotary tool is inserted to said copper or copper alloy, wherein said pin portion is inserted to said silver-copper alloy coat layer but is not inserted to said iron or iron alloy.

3. A friction stir welding method as set forth in claim 1, wherein one of said members to be welded is stainless steel, while the other of said members is copper or a copper alloy, the welding surface of said stainless steel is coated with the same material as the other of said members, and said pin portion of said rotary tool is inserted to said copper or copper alloy, wherein said pin portion is inserted to said copper or copper alloy coat layer formed on the side of said stainless steel but is not inserted to said stainless steel.

4. A friction stir welding method as set forth in claim 1, wherein one of said members to be welded is iron or an iron alloy, while the other of said members is aluminum or an aluminum alloy, a welding surface of said iron or iron alloy is coated with nickel, and said pin portion of said rotary tool is inserted to said aluminum or aluminum alloy, wherein said pin portion is inserted to said nickel coat layer but is not inserted to said iron or iron alloy.

5. A semiconductor apparatus comprising:

a heat sink; and a semiconductor device on said heat sink; and wherein said heat sink is composed of a friction stir welded component part which is welded by a friction stir welding method for welding by inserting a pin portion of a rotary tool having said pin portion and a shoulder portion to abutment surfaces of two members to be welded which differ in physical properties and/or mechanical properties, and moving said rotary tool along said abutment surfaces, and wherein said pin portion is inserted only to one of said members, said pin portion is not inserted to the other of said members, only said shoulder portion is set in contact with the other of said members, and, while this condition is maintained, said rotary tool is moved, and wherein a trace of plastic flow attendant on a friction stir phenomenon is seen in the vicinity of the weld portion of one of said members, and a reaction layer due to diffusion of atoms is seen at the weld portion of both of said members.

\* \* \* \* \*